US008748892B2

(12) United States Patent
Cho et al.

(10) Patent No.: US 8,748,892 B2
(45) Date of Patent: Jun. 10, 2014

(54) THIN FILM TRANSISTOR AND METHOD FOR FABRICATING THE SAME

(75) Inventors: Yong-Soo Cho, Daegu (KR); Kyo-Ho Moon, Daegu (KR); Hoon Choi, Incheon (KR)

(73) Assignee: LG Display Co., Ltd., Seoul (KR)

( * ) Notice: Subject to any disclaimer, the term of this patent is extended or adjusted under 35 U.S.C. 154(b) by 224 days.

(21) Appl. No.: 12/576,591

(22) Filed: Oct. 9, 2009

(65) Prior Publication Data

US 2011/0084278 A1    Apr. 14, 2011

(51) Int. Cl.
| H01L 31/00 | (2006.01) |
| H01L 29/04 | (2006.01) |
| H01L 29/10 | (2006.01) |
| H01L 21/00 | (2006.01) |
| H01L 21/84 | (2006.01) |

(52) U.S. Cl.
USPC ............................................. 257/59; 438/158

(58) Field of Classification Search
USPC .............. 257/59, E29.296, E21.241; 438/149
See application file for complete search history.

(56) References Cited

U.S. PATENT DOCUMENTS

| 6,037,017 | A * | 3/2000 | Kashiro ........................ 427/579 |
| 6,172,369 | B1 * | 1/2001 | Waechter et al. ......... 250/370.09 |
| 6,462,802 | B1 * | 10/2002 | Nishimura et al. ........... 349/147 |
| 6,788,355 | B1 * | 9/2004 | Ihida et al. ...................... 349/43 |
| 8,106,864 | B2 * | 1/2012 | Moon et al. ...................... 345/87 |
| 2003/0098939 | A1 * | 5/2003 | Min et al. ....................... 349/141 |
| 2004/0222472 | A1 * | 11/2004 | Suzuki et al. ................. 257/365 |
| 2005/0140308 | A1 * | 6/2005 | Park ............................ 315/169.3 |
| 2005/0270452 | A1 * | 12/2005 | Ahn et al. ..................... 349/114 |
| 2006/0170845 | A1 * | 8/2006 | Lee ................................ 349/114 |
| 2007/0207574 | A1 * | 9/2007 | Wang et al. ................... 438/149 |
| 2007/0247416 | A1 * | 10/2007 | Chang et al. .................. 345/102 |
| 2008/0083927 | A1 * | 4/2008 | Nishiura et al. ................ 257/72 |
| 2008/0116501 | A1 * | 5/2008 | Lin et al. ....................... 257/315 |
| 2009/0212288 | A1 * | 8/2009 | Kim et al. ....................... 257/57 |
| 2010/0006835 | A1 * | 1/2010 | Yoon et al. ...................... 257/43 |
| 2010/0032679 | A1 * | 2/2010 | Kawae et al. ................... 257/72 |
| 2010/0231492 | A1 * | 9/2010 | Moon et al. ..................... 345/87 |
| 2011/0157490 | A1 * | 6/2011 | Morimoto et al. ............. 348/790 |

* cited by examiner

*Primary Examiner* — Matthew Landau
*Assistant Examiner* — Igwe U Anya
(74) *Attorney, Agent, or Firm* — Birch, Stewart, Kolasch & Birch, LLP

(57) ABSTRACT

The present invention relates to a thin-film transistor in a liquid crystal display device and a method of fabricating the same, and the thin-film transistor may be configured by including a first gate electrode formed on an insulating substrate; a first gate insulation film formed on the insulating substrate including the first gate electrode; an active layer formed on the first gate insulation film; source/drain electrodes formed on the active layer and arranged at both sides of the first gate electrode; a second gate insulation film formed on the active layer and the first gate insulation film including the source/drain electrodes and provided with a contact hole for exposing part of the drain electrode; a second gate electrode overlapped with the first gate electrode on the second gate insulation film; and a pixel electrode electrically connected to the drain electrode through the contact hole.

9 Claims, 3 Drawing Sheets

THIN FILM TRANSISTOR AND METHOD FOR FABRICATING THE SAME

BACKGROUND OF THE INVENTION

1. Field of the Invention

The present invention relates to a liquid crystal display device, and more particularly, to a thin-film transistor in a liquid crystal display device and a method for fabricating the same in which an on-current of the thin-film transistor can be enhanced and an off-current thereof can be reduced by using a thin-film transistor having a dual gate structure.

2. Description of the Related Art

With the development of information society, a demand has been gradually increased for various types of display devices, and accordingly, in recent years, various flat-panel display devices have been studied such as a liquid crystal device (LCD), a plasma display pane (PDP), an electro luminescent display (ELD), a vacuum fluorescent display (VFD), and the like, and some of them have been already used as a display device in various equipment units.

Among these flat panel display devices, LCD devices are most widely used for mobile image display devices in place of CRT monitors due to their characteristics and advantages such as excellent display quality, light weight, thin profile, low power consumption, and the like. Also, such LCD devices have been developed in various ways for a monitor of television sets and computers, which can receive and display broadcasting signals, as well as a mobile display device such as a monitor of notebook computers.

In general, a liquid crystal display device is largely classified into a liquid crystal panel for displaying an image and a driving unit for applying a drive signal to the liquid crystal panel, in which the liquid crystal panel is configured with a first and a second glass substrates attached to each other with a predetermined space therebetween, and a liquid crystal layer injected between the first and the second glass substrates.

Here, the first glass substrate (TFT array substrate) is formed with a plurality of gate lines arranged at a predetermined distance from each other in one direction, a plurality of data lines arranged at a predetermined distance from each other in a direction perpendicular to each of the gate lines, a plurality of pixel electrodes being formed in a matrix type arrangement at each of the pixel regions defined by crossing the data lines and the gate lines with each other, and a plurality of thin-film transistors being switched by a signal of the gate line to transmit a signal of the data line to each of the pixel electrodes.

Furthermore, the second glass substrate (color filter substrate) is formed with a light-shielding layer for blocking light from a portion excluding the pixel region, a RGB color filter layer for displaying colors, and a common electrode for forming an image.

In addition, the first and the second substrates are adhered to each other by a seal member having liquid crystal injection ports arranged with a predetermined space therebetween by a spacer.

A thin-film transistor in a liquid crystal display device having the foregoing construction according to the related art includes a gate electrode, a gate insulation film, an active layer, and source/drain electrodes, and it will be described below in accordance with FIG. 1.

FIG. 1 is a cross-sectional view schematically illustrating a thin-film transistor provided in a liquid crystal display device according to the related art.

Referring to FIG. 1, a thin-film transistor in a liquid crystal display device according to the related art includes a gate electrode 13 formed on an insulating substrate 11, a gate insulation film 15 formed at a front surface of the insulating substrate 11 including the gate electrode 13, an active layer 17 formed on the gate insulation film 15 being overlapped with the gate electrode 13, source/drain electrodes 21a and 21b formed on the active layer 17 in both sides of the gate electrode 13, a protective film 23 formed at a front surface of the substrate including the source/drain electrodes 21a and 21b.

Here, the gate electrode 13 is vertically formed to be extended from a gate line (not shown), and the source electrode 21a is vertically formed to be extended from a data line (not shown), which is arranged to be crossed with the gate line (not shown).

Furthermore, the active layer 17 is an amorphous semiconductor layer used as a channel layer, and an ohmic contact layer 19, made of an amorphous silicon layer in which impurities are doped, is formed thereon.

Furthermore, though not shown in the drawing, the drain electrode 21b is connected to a pixel electrode (not shown) through a contact hole (not shown) formed on the protective film 23.

A method of fabricating a thin-film transistor in a liquid crystal display device having the foregoing construction according to the related art will be described below in accordance with FIG. 1.

Referring to FIG. 1, a gate electrode 13 is formed by depositing a metal film on a insulating substrate (thin-film transistor array substrate) 11, and selectively removing the metal film through a photo and etching process.

Next, a gate insulation film 15 is formed by depositing an inorganic insulation material such as a silicon nitride film on the insulating substrate 11 including the gate electrode 13.

Subsequently, an active layer 17 and an ohmic contact layer 19 are formed by sequentially depositing an amorphous silicon layer and an amorphous silicon layer doped with impurities on the gate insulation film 15, and then selectively removing the amorphous silicon layer and the amorphous silicon layer doped with impurities through a photo and etching process.

Next, source/drain electrodes 21a and 21b, which are apart from each other with a predetermined distance on the active layer 17 and the gate insulation film 15 in both sides of the gate electrode 13, are formed by depositing a metal film at a front surface of the substrate including the ohmic contact layer 19 and the active layer 17, and then selectively removing the metal film through a photo and etching process.

Subsequently, an interlayer insulating film 23 is formed by depositing an inorganic insulation material such as a silicon nitride film at a front surface of the substrate including the source/drain electrodes 21a and 21b.

Next, though not shown in the drawing, a contact hole (not shown) for exposing the drain electrode 21b is formed by selectively removing the 23 through a photo and etching process.

Subsequently, though not shown in the drawing, a pixel electrode (not shown), which is electrically connected to the drain electrode 21b through the contact hole (not shown), is formed by depositing a conductive transparent material on the interlayer insulating film 23 including the contact hole (not shown), and then selectively removing the deposited material.

However, according to a thin-film transistor in a liquid crystal display device and a method for fabricating the same according to the related art, there is a problem as follows.

A thin-film transistor in a liquid crystal display device and a fabrication method thereof according to the related art is proceeded with a fabrication process with a typical back channel etched (BCE) invert-staggered TFT structure, and thus it has an advantage of maximizing the fabrication yield through a simplified process using a 4-mask process, but it is difficult to control an off-current due to contamination of a back channel, as well as difficult to control a threshold voltage. In other words, it may produce a large distribution of off-currents and reduce electron mobility based on the back channel process conditions, thereby decreasing on-current.

Specifically, in case of a gate-in-panel (GIP) type liquid crystal display device in which a driving IC is inserted into a panel, unlike a TFT in an active array unit, a TFT in a GIP circuit unit has a large channel width and thus it is not easy to control a threshold voltage (Vth) and the characteristics of threshold voltage (Vth) and off-current (Ioff) in the circuit unit is unavoidably deteriorated when performing an optimization on the element performance for the TFT performance required by the active array unit. Furthermore, in a thin-film transistor according to the related art, a channel is formed only to the one side in which a gate is located, and thus it is disadvantageous in the aspect of an on-current.

SUMMARY OF THE INVENTION

The present invention is contrived to solve the aforementioned problems according to the related art and an object of the invention is to provide a thin-film transistor in a liquid crystal display device and a method of fabricating the same in which in which an on-current of the thin-film transistor can be enhanced and an off-current thereof can be reduced through the control of a back channel by forming a thin-film transistor having a dual gate structure that is formed with a back gate as a pixel electrode.

In order to accomplish the foregoing object, a thin-film transistor in a liquid crystal display device according to the present invention includes a first gate electrode formed on an insulating substrate; a first gate insulation film formed on the insulating substrate including the first gate electrode; an active layer formed on the first gate insulation film; source/drain electrodes formed on the active layer and arranged at both sides of the first gate electrode; a second gate insulation film formed on the active layer and the first gate insulation film including the source/drain electrodes and provided with a contact hole for exposing part of the drain electrode; a second gate electrode overlapped with the first gate electrode on the second gate insulation film; and a pixel electrode electrically connected to the drain electrode through the contact hole.

In order to accomplish the foregoing object, a method of fabricating a thin-film transistor in a liquid crystal display device according to the present invention includes the steps of forming a first gate electrode on an insulating substrate; forming a first gate insulation film on the insulating substrate including the first gate electrode; forming an active layer overlapped with the first gate electrode on the first gate insulation film; forming source/drain electrodes apart from each other with a predetermined distance on the active layer; forming a second gate insulation film on the active layer including the source/drain electrodes and the first gate insulation film; forming a contact hole exposing part of the drain electrode by selectively removing part of the second gate insulation film; and forming a second gate electrode overlapped with the first gate electrode on the second gate insulation film, and at the same time, a pixel electrode electrically connected to the drain electrode through the contact hole.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, a thin-film transistor in a liquid crystal display device and a method of fabricating the same according to the present invention will be described in detail with reference to the accompanying drawings.

Figure 1:
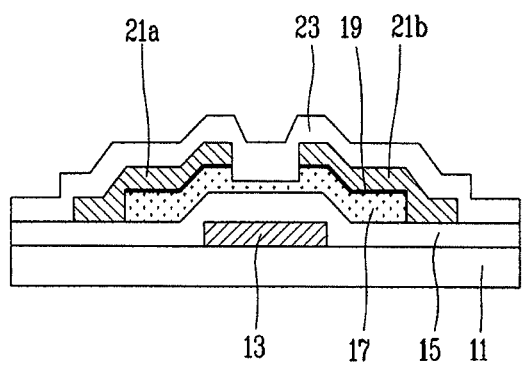
FIG. 1 is a cross-sectional view schematically illustrating a thin-film transistor provided in a liquid crystal display device according to the related art.
Figure 2:
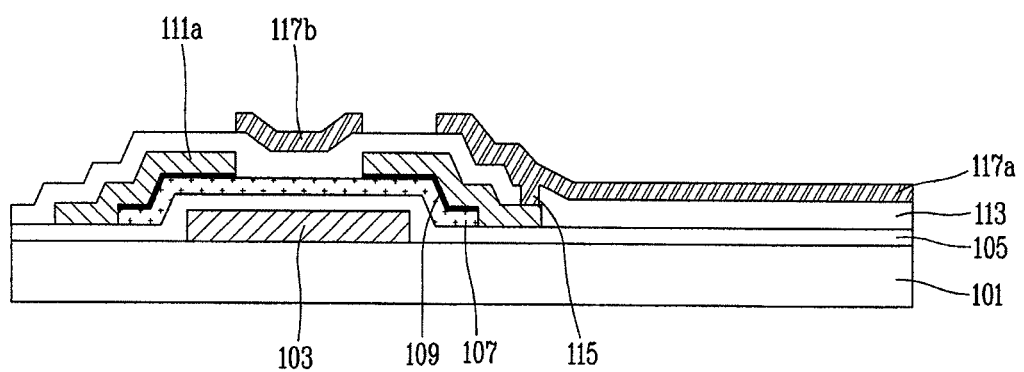
FIG. 2 is a cross-sectional view schematically illustrating a thin-film transistor provided in a liquid crystal display device according to the present invention.

FIG. 2 is a cross-sectional view schematically illustrating a thin-film transistor provided in a liquid crystal display device according to the present invention.

Though not shown in the drawing, a thin-film transistor having a dual gate structure according to the present invention includes a first gate electrode 103 formed on an insulating substrate 101, a first gate insulation film 105 formed at a front surface of the insulating substrate 101 including the first gate electrode 103, an active layer 107 and an ohmic contact layer 109 formed on the first gate insulation film 105 being overlapped with the first gate electrode 103, source/drain electrodes 111a and 111b formed on the active layer 107 in both sides of the first gate electrode 103, a second gate insulation film 113 formed at a front surface of the substrate including the source/drain electrodes 111a and 111b, a second gate insulation film 113 formed at a front surface of the substrate including the source/drain electrodes 111a and 111b, a pixel electrode 117a electrically connected to the drain electrode 111b through a contact hole 115 formed on the second gate insulation film 113, and a second gate electrode (that is, back gate) 117b formed by corresponding to the first gate electrode 103.

Here, the first gate electrode 103, when applied to a liquid crystal display device, is vertically formed to be extended from a gate line (not shown), and the source electrode 111a is vertically formed to be extended from a data line (not shown), which is arranged to be crossed with the gate line (not shown).

Furthermore, the active layer 107 is formed of an amorphous semiconductor layer used as a channel layer, and the ohmic contact layer 109 is formed of an amorphous silicon layer in which impurities are doped.

In addition, aluminum (Al), aluminum alloy (AlNd), chrome (Cr), tungsten (W), molybdenum (Mo), or the like, may be used for a metal material forming the first gate electrode 103.

Furthermore, a transparent conductive material, for example, indium-tin-oxide (ITO) and indium-zinc-oxide (IZO), or a metal such as MoTi, Cu, MoNb, Mo, Cr, and AlNd, may be used for a metal material forming the pixel electrode 117a and the second gate electrode 117b.

As a result, the present invention provides a thin-film transistor having a dual gate structure including the first and second gate electrodes 103 and 117b, thereby allowing the second gate electrode 117b to operate as a back gate to electrically control a back channel. Here, the first and a second gate electrodes 103 and 117b, in the present invention, are electrically connected to each other, but their explanation will be omitted herein.

A method of fabricating a thin-film transistor in a liquid crystal display device having the foregoing construction according to the present invention will be described below with reference to FIGS. 3A through 3E.

FIGS. 3A through 3E are cross-sectional views illustrating a process of fabricating a thin-film transistor in a liquid crystal display device according to the present invention.

Figure 4:
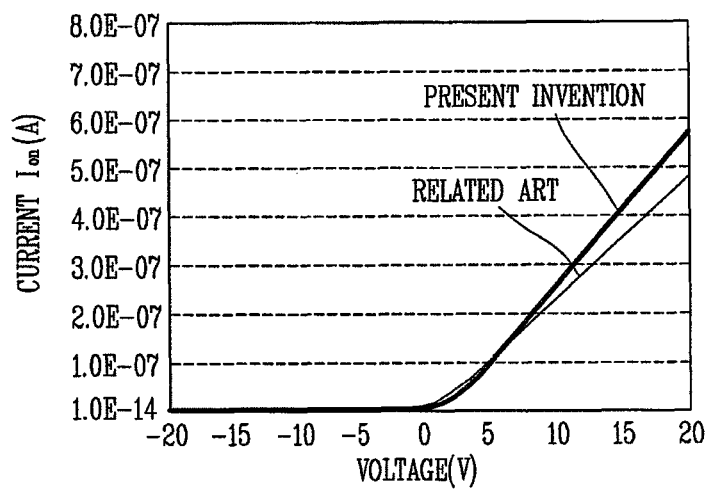
FIG. 4 is a view illustrating the variation of an on-current (Ion) based on the applied voltage, as a graph illustrating the electrical characteristic of a thin-film transistor in a liquid crystal display device according to the present invention.
Figure 5:
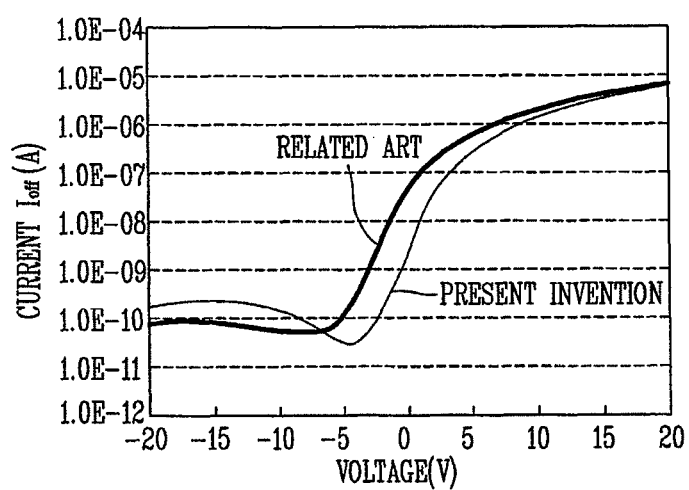
FIG. 5 is a view illustrating the variation of an off-current (Ioff) based on the applied voltage, as a graph illustrating the electrical characteristic of a thin-film transistor in a liquid crystal display device according to the present invention.

FIG. 4 is a view illustrating the variation of an on-current (Ion) based on the applied voltage, as a graph illustrating the electrical characteristic of a thin-film transistor in a liquid crystal display device according to the present invention. FIG. 5 is a view illustrating the variation of an off-current (Ioff) based on the applied voltage, as a graph illustrating the electrical characteristic of a thin-film transistor in a liquid crystal display device according to the present invention.

Figure 3A:
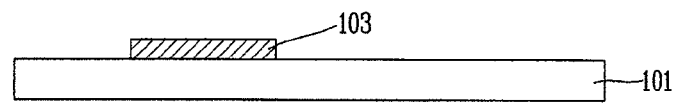
FIGS. 3A through 3E are cross-sectional views illustrating a process of fabricating a thin-film transistor in a liquid crystal display device according to the present invention.

As illustrated in FIG. 3A, a gate electrode 103 is formed by depositing a metal film on a insulating substrate (thin-film transistor array substrate) 101, and selectively removing the metal film through a photo and etching process. At this time, aluminum (Al), aluminum alloy (AlNd), chrome (Cr), tungsten (W), molybdenum (Mo), or the like, may be used for a metal material forming the first gate electrode 103.

Figure 3B:
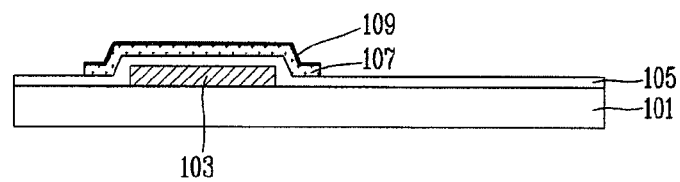

Next, as illustrated in FIG. 3B, a gate insulation film 105 is formed by depositing an inorganic insulation material such as a silicon nitride film, a silicon oxide film, or the like, on the insulating substrate 101 including the first gate electrode 103.

Subsequently, an active layer 107 and an ohmic contact layer 109 are formed by sequentially depositing an amorphous silicon layer and an amorphous silicon layer doped with impurities on the first gate insulation film 105, and then selectively removing the amorphous silicon layer and the amorphous silicon layer doped with impurities through a photo and etching process.

Figure 3C:
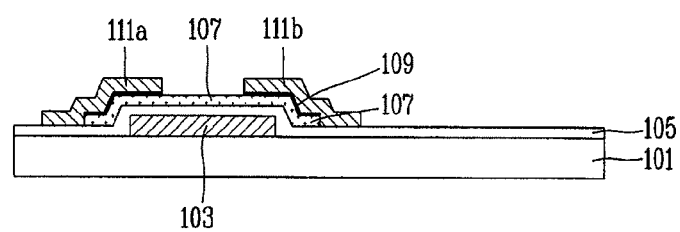

Next, as illustrated in FIG. 3C, source/drain electrodes 111a and 111b, which are apart from each other with a predetermined distance as much as a channel region thereof on the active layer 107 and the gate insulation film 105 in both sides of the first gate electrode 103, are formed by depositing a metal film at a front surface of the substrate including the ohmic contact layer 109 and the active layer 107, and then selectively removing the metal film through a photo and etching process. At this time, aluminum (Al), aluminum alloy (AlNd), chrome (Cr), tungsten (W), molybdenum (Mo), or the like, may be used for a metal material forming the source/drain electrodes 111a, 111b.

Figure 3D:
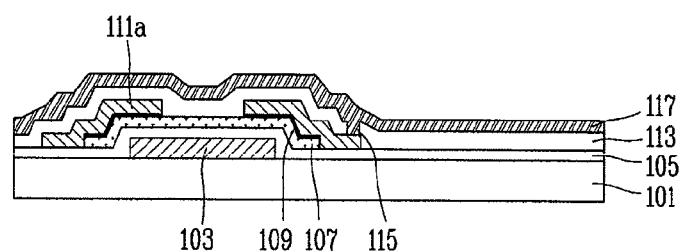

Subsequently, as illustrated in FIG. 3D, a second gate insulation film 113 is formed by depositing an inorganic insulation material such as a silicon nitride film, a silicon oxide film, or the like, at a front surface of the substrate including the source/drain electrodes 111a and 111b. At this time, the second gate insulation film 113 is formed on the source/drain electrodes 111a and 111b and the first gate insulation film 105 including an exposed upper surface of the active layer 107 corresponding to a channel region.

Next, a contact hole 115 for exposing the drain electrode 111b is formed by selectively removing the second gate insulation film 113 through a photo and etching process, and then a conductive transparent material or metal material is deposited on the interlayer insulating film 113 including the contact hole 115. At this time, a transparent conductive material such as indium-tin-oxide (ITO), indium-zinc-oxide (IZO), etc., or a metal such as MoTi, Cu, MoNb, Mo, Cr, AlNd, etc., may be used for the conductive transparent or metal material.

Figure 3E:
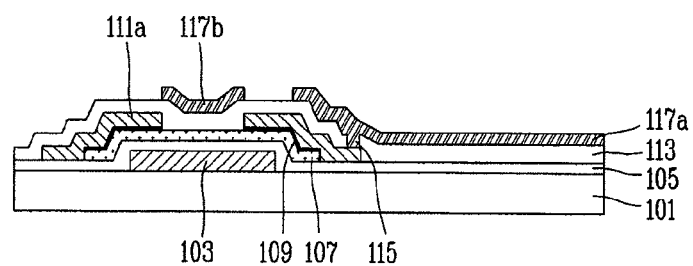

Subsequently, as illustrated in FIG. 3E, a pixel electrode 117a, which is electrically connected to the drain electrode 111b through the contact hole 115, is formed by selectively removing through a photo and etching process, and at the same time, a second gate electrode 117b to be used as a back gate on the second gate insulation film 113 corresponding to the first gate electrode 103 is formed, thereby completing the process of fabricating a thin-film transistor applied to a liquid crystal display device will be completed.

On the other hand, the electrical characteristics of a thin-film transistor having a dual gate structure according to the present invention, which is fabricated in the foregoing process sequence, are illustrated in FIGS. 4 and 5. For example, FIG. 4 is an on-current graph illustrated in case of assuming that the gate voltage is about 20 V and the drain voltage is 1 V, and FIG. 5 is an off-current graph illustrated in case of assuming that the gate voltage is about 5 V and the drain voltage is 15 V.

Referring to FIG. 4, an on-current (Ion) based on the applied voltage (V) in a thin-film transistor according to the present invention is remarkably enhanced by more than 18% compared to that of the related art.

Referring to FIG. 5, an off-current (Ioff) based on the applied voltage (V) in a thin-film transistor according to the present invention is remarkably reduced by more than 69% compared to that of the related art.

Furthermore, referring to FIGS. 4 and 5, in case of the present invention, the threshold voltage is decreased, and thus it is possible to control a threshold voltage of the element. For example, it is shown that the threshold voltage is +1.2 V when the drain voltage is 1 V, and the threshold voltage is +2.4 V when the drain voltage is 15 V.

As described above, according to the present invention, it is possible to control a current flow through the back channel as well as a current mobility through the front channel provided by a thin-film transistor having a typical back channel etched (BCE) invert-staggered structure because a thin-film transistor having a dual gate structure using a metal film forming the pixel electrode as a back gate, i.e., second gate electrode, can be applied. In other words, according to the present invention, it is possible to control such a current flow, thereby reducing an off-current (Ioff) and enhancing an on-current (Ion) through the control of a back channel.

Moreover, in recent years, a model for enhancing the cost competitiveness by reducing the number of driver ICs through the development of system-on-glass (SOG) has been studied, and such a panel driving capability through SOG is determined by the performance of an on-current (Ion) and an off-current (Ioff).

Consequently, according to the present invention, it is possible to reduce the number of driver ICs by using a thin-film transistor having a dual gate structure, in which a back gate is formed of a metal film for pixel electrodes, because an off-current (Ioff) of the thin-film transistor is reduced but an on-current (Ion) thereof is enhanced. As a result, it may be applicable to a system-on-glass (SOG) or gate-in-panel (GIP) product for enhancing the cost competitiveness.

On the other hand, a thin-film transistor having a dual gate structure in a liquid crystal display device according to another embodiment of the present invention may be configured by electrically connecting the second gate electrode 117b used as a back gate to a source electrode 111a or drain electrode 111b. At this time, according to a method of electrically connecting the second gate electrode 117b to a source electrode 111a or drain electrode 111b, the thin-film transistor is configured by forming a interlayer insulating film (not shown) on the second gate electrode 117b, and then forming a contact hole (not shown) by selectively etching the interlayer insulating film and an interlayer insulating film 113 disposed therebeneath, and then forming a conductive material on the interlayer insulating film (not shown) including the contact hole and electrically connecting the second gate electrode 117b to the source electrode 111a or the drain electrode 111b through the contact hole.

Here, in case of electrically connecting the second gate electrode 117b to the source electrode 111a, it is shown that the off-current characteristic is reduced and the hole current is decreased, thereby providing an excellent off-current characteristic as a whole. As a result, in this case, it may be applicable to an array unit or gate-in-panel unit in which the off-current characteristic serves as an important factor.

Furthermore, in case of electrically connecting the second gate electrode 117b to the drain electrode 111b, it is shown that the on-current is greatly enhanced and the off-current characteristic is also greatly enhanced.

On the other hand, though not shown in the drawing, a liquid crystal display device including a thin-film transistor having a dual gate structure according to the present invention will be briefly described as follows.

A liquid crystal display device provided with a thin-film transistor having a dual gate structure according to the present invention is largely classified into a liquid crystal panel for displaying an image and a driving unit for applying a drive signal to the liquid crystal panel, in which the liquid crystal panel is configured with a first and a second insulating substrates attached to each other with a predetermined space therebetween, and a liquid crystal layer injected between the first and the second insulating substrates.

Here, the first insulating substrate (TFT array substrate) is formed with a plurality of gate lines arranged at a predetermined distance from each other in one direction, a plurality of data lines arranged at a predetermined distance from each other in a direction perpendicular to each of the gate lines, a plurality of pixel electrodes being formed in a matrix type arrangement at each of the pixel regions defined by crossing the data lines and the gate lines with each other, and a plurality of thin-film transistors being switched by a signal of the gate line to transmit a signal of the data line to each of the pixel electrodes.

On the other hand, though not shown in the drawing, the second insulating substrate (color filter substrate) has opening portions each corresponding to pixel regions formed at a lower substrate, and is configured by including a black matrix layer for performing a light blocking function, a RGB color filter layer for displaying colors, and a common electrode for forming an image in cooperation with the pixel electrode.

The first insulating substrate and the second insulating substrate have a predetermined space by a spacer and a liquid crystal layer is filled between those two substrates to configure a liquid crystal display device.

In addition, the first and the second substrates are adhered to each other by a seal member having liquid crystal injection ports arranged with a predetermined space therebetween by a spacer.

On the other hand, Referring to FIG. 2, the thin-film transistor includes a first gate electrode 103 formed on an insulating substrate 101, a first gate insulation film 105 formed at a front surface of the insulating substrate 101 including the first gate electrode 103, an active layer 107 and an ohmic contact layer 109 formed on the first gate insulation film 105 being overlapped with the first gate electrode 103, source/drain electrodes 111a and 111b formed on the active layer 107 in both sides of the first gate electrode 103, a second gate insulation film 113 formed at a front surface of the substrate including the source/drain electrodes 111a and 111b, a second gate insulation film 113 formed at a front surface of the substrate including the source/drain electrodes 111a and 111b, a pixel electrode 117a electrically connected to the drain electrode 111b through a contact hole 115 formed on the second gate insulation film 113, and a second gate electrode (that is, back gate) 117b formed by corresponding to the first gate electrode 103.

Here, the first gate electrode 103, when applied to a liquid crystal display device, is vertically formed to be extended from a gate line (not shown), and the source electrode 111a is vertically formed to be extended from a data line (not shown), which is arranged to be crossed with the gate line (not shown).

Furthermore, the active layer 107 is formed of an amorphous semiconductor layer used as a channel layer, and the ohmic contact layer 109 is formed of an amorphous silicon layer in which impurities are doped.

In addition, aluminum (Al), aluminum alloy (AlNd), chrome (Cr), tungsten (W), molybdenum (Mo), or the like, may be used for a metal material forming the first gate electrode 103.

Furthermore, a transparent conductive material such as indium-tin-oxide (ITO) and indium-zinc-oxide (IZO), or a metal such as MoTi, Cu, MoNb, Mo, Cr, and AlNd, is used for a metal material forming the pixel electrode 117a and the second gate electrode 117b.

As a result, the present invention provides a thin-film transistor having a dual gate structure including the first and second gate electrodes 103 and 117b, thereby allowing the second gate electrode 117b to operate as a back gate to electrically control a back channel.

A thin-film transistor in a liquid crystal display device and a method for fabricating the same has the following effects.

According to the present invention, it is possible to control a current flow through the back channel as well as a current mobility through the front channel provided by a thin-film transistor having a typical back channel etched (BCE) invert-staggered structure because a thin-film transistor having a dual gate structure using a metal film forming the pixel electrode as a back gate, i.e., second gate electrode, can be applied. In other words, according to the present invention, it is possible to control such a current flow, thereby reducing an off-current (Ioff) and enhancing an on-current (Ion) through the control of a back channel.

Moreover, in recent years, a model for enhancing the cost competitiveness by reducing the number of driver ICs through the development of system-on-glass (SOG) has been studied, and such a panel driving capability through SOG is determined by the performance of an on-current (Ion) and an off-current (Ioff).

Consequently, according to the present invention, it is possible to reduce the number of driver ICs by using a thin-film transistor having a dual gate structure, in which a back gate is formed of a metal film for pixel electrodes, because an off-current (Ioff) of the thin-film transistor is reduced but an on-current (Ion) thereof is enhanced. As a result, it may be applicable to a system-on-glass (SOG) or gate-in-panel (GIP) product for enhancing the cost competitiveness.

Though the present invention is described with reference to preferred embodiments, various modifications and improvements will become apparent to those skilled in the art without departing from the spirit and scope of the present invention as defined in the following claims

What is claimed is:

1. A thin-film transistor in a liquid crystal display device, comprising:
    a first gate electrode formed on an insulating substrate;
    a first gate insulation film formed on the insulating substrate including the first gate electrode;
    an amorphous active layer formed on the first gate insulation film, wherein an entire bottom surface of the amorphous active layer is in contact with the first gate insulation film, the amorphous active layer having a first portion that extends on the first gate insulation film and does not overlap with the first gate electrode;
    an ohmic contact layer on the amorphous active layer, wherein the ohmic contact layer is formed of amorphous layer in which impurities are doped, and the ohmic contact layer has a second portion that extends on the amorphous active layer and does not overlap with the first gate electrode;
    source/drain electrodes formed on the active layer and arranged at both sides of the first gate electrode;
    a second gate insulation film formed on the active layer, the first gate insulation film, and the source/drain electrodes and provided with a contact hole for exposing part of the drain electrode, wherein the contact hole is formed over the first portion of the amorphous active layer and the second portion of the ohmic contact layer, and the second gate insulation film is further provided with a depression over the first gate electrode;
    a second gate electrode overlapped with the first gate electrode and formed on the second gate insulation film and in the depression, wherein one end portion of the second gate electrode is overlapped with the source electrode and a source end of the ohmic contact layer and wherein another end portion of the second gate electrode is overlapped with the gate electrode and a gate end of the ohmic contact layer; and
    a pixel electrode electrically connected to the drain electrode through the contact hole,
    wherein the second gate electrode and the pixel electrode are formed of a metal including at least one of MoTi, Cu, MoNb, Mo, Cr or AlNd,
    wherein the source electrode is in contact with one vertical side surface of the amorphous active layer, and the drain electrode is in contact with the other vertical side surface of the amorphous active layer, and
    wherein one end of the ohmic contact layer coincides with the one vertical surface of the amorphous active layer and another end of the ohmic contact layer coincides with the other vertical side surface of the amorphous active layer so that the amorphous active layer does not extend beyond the one vertical surface and the other vertical surface of the amorphous active layer.

2. The thin-film transistor in a liquid crystal display device of claim 1, wherein the second gate electrode and the pixel electrode are formed of the same material.

3. The thin-film transistor in a liquid crystal display device of claim 1, wherein the second gate electrode is electrically connected to the first gate electrode, the source electrode, or the drain electrode.

4. The thin-film transistor in a liquid crystal display device of claim 1, wherein the second gate insulation film is in contact with an exposed upper surface of the amorphous active layer that is not recessed.

5. The thin-film transistor in a liquid crystal display device of claim 1, wherein a height of both side ends of the second gate electrode is higher than that of any part of the second gate insulation film.

6. A method of fabricating a thin-film transistor in a liquid crystal display device, the method comprising:
    forming a first gate electrode on an insulating substrate;
    forming a first gate insulation film on the insulating substrate including the first gate electrode;
    forming an amorphous active layer overlapped with the first gate electrode, wherein an entire bottom surface of the amorphous active layer is formed on and in contact with the first gate insulation film, the amorphous active layer having a first portion that extends on the first gate insulation film and does not overlap with the first gate electrode;
    forming an ohmic contact layer on the amorphous active layer, wherein the ohmic contact layer is formed of amorphous layer in which impurities are doped, and the ohmic contact layer has a second portion that extends on the amorphous active layer and does not overlap with the first gate electrode;
    forming source/drain electrodes apart from each other with a predetermined distance on the active layer;
    forming a second gate insulation film on the active layer, the source/drain electrodes and the first gate insulation film;
    forming a depression and a contact hole exposing part of the drain electrode by selectively removing part of the second gate insulation film, wherein the depression is provided over the first gate electrode, and wherein the contact hole is formed over the first portion of the amorphous active layer and the second portion of the ohmic contact layer; and
    forming a second gate electrode overlapped with the first gate electrode and formed on the second gate insulation film and in the depression, and at the same time, a pixel electrode electrically connected to the drain electrode through the contact hole, wherein one end portion of the second gate electrode is overlapped with the source electrode and a source end of the ohmic contact layer and wherein another end portion of the second gate electrode is overlapped with the gate electrode and a gate end of the ohmic contact layer,
    wherein the second gate electrode and the pixel electrode are formed of a metal including at least one of MoTi, Cu, MoNb, Mo, Cr or AlNd,
    wherein the source electrode is in contact with one vertical side surface of the amorphous active layer, and the drain electrode is in contact with the other vertical side surface of the amorphous active layer, and
    wherein one end of the ohmic contact layer coincides with the one vertical surface of the amorphous active layer and another end of the ohmic contact layer coincides with the other vertical side surface of the amorphous active layer so that the amorphous active layer does not extend beyond the one vertical surface and the other vertical surface of the amorphous active layer.

7. The method of fabricating a thin-film transistor in a liquid crystal display device of claim 6, wherein the second gate electrode and the pixel electrode are formed of the same material.

8. The method of fabricating a thin-film transistor in a liquid crystal display device of claim 6, wherein the second gate insulation film is in contact with an exposed upper surface of the amorphous active layer that is not recessed.

9. The method of fabricating a thin-film transistor in a liquid crystal display device of claim 6, wherein a height of both side ends of the second gate electrode is higher than that of the second gate insulation film.

* * * * *